(12) United States Patent
Kuo et al.

(10) Patent No.: US 6,386,275 B1
(45) Date of Patent: May 14, 2002

(54) SURROUNDING TYPE FIN-RETAINING STRUCTURE OF HEAT RADIATOR

(75) Inventors: Dah-Chyi Kuo; Chen-Hsing Lee, both of Sanchung (TW)

(73) Assignee: Chaun-Choung Technology Corp., Taipei Hsien (TW)

( * ) Notice: Subject to any disclaimer, the term of this patent is extended or adjusted under 35 U.S.C. 154(b) by 0 days.

(21) Appl. No.: 09/930,293

(22) Filed: Aug. 16, 2001

(51) Int. Cl.[7] ................................................. H05K 7/20
(52) U.S. Cl. ...................... 165/80.3; 165/185; 361/704; 174/16.3
(58) Field of Search ................................ 165/80.3, 154, 165/183, 185, 76, 121, 125; 361/697, 704, 710; 174/16.3; 257/719, 722

(56) References Cited

U.S. PATENT DOCUMENTS

| | | | | |
|---|---|---|---|---|
| 1,339,385 A | * | 5/1920 | Guyer | 122/367.3 |
| 2,429,508 A | * | 10/1947 | Belaieff | 165/125 |
| 2,653,800 A | * | 9/1953 | Anton | 165/80.3 |
| 2,792,200 A | * | 5/1957 | Huggins et al. | 165/10 |
| 3,305,013 A | * | 2/1967 | Freidel | 165/183 |
| 5,132,780 A | * | 7/1992 | Higgins, III | 165/104.34 |
| 5,561,338 A | * | 10/1996 | Roberts et al. | 165/185 |
| 5,583,746 A | * | 12/1996 | Wang | 165/122 |

* cited by examiner

*Primary Examiner*—Allen Flanigan
(74) *Attorney, Agent, or Firm*—Rosenberg, Klein & Lee

(57) ABSTRACT

The present invention proposes a surrounding type fin-retaining structure of heat radiator comprising a retaining tool and a plurality of fins. The retaining tool is integrally formed. The fins are formed by punching metal sheets. Each of the metal sheets comprises a main body provided with frills. Each of the frills has a groove with gaps at a predetermined position thereof. After the plurality of fins are tightly arranged together, the grooves on the frills will be tightly joined together to form a surrounding and closed shape. The retaining tool is manufactured to have the same size and shape as those of the grooves. The retaining tool is placed into the grooves and retained therein to fix the fins of a heat radiator.

6 Claims, 7 Drawing Sheets

SURROUNDING TYPE FIN-RETAINING STRUCTURE OF HEAT RADIATOR

FIELD OF THE INVENTION

The present invention relates to a surrounding type fin-retaining structure of heat radiator and, more particularly, to a retaining structure, wherein grooves on frills of fins are tightly joined together to form a surrounding and closed shape, and a retaining tool matching the shape of the grooves is embedded in the grooves to fix the fins of a heat radiator.

BACKGROUND OF THE INVENTION

Heat radiators play an important role in heat-emitting electronic parts. As electronic parts have more and more powerful functions, their volume of generated heat becomes greater and greater. Without heat radiators to radiate out large quantities of heat to the outside, heat-emitting electronic parts will easily be damaged due to high temperature. Heat radiator types can be divided into aluminum-extrusion type, die-casting type, and folding type. A folding type heat radiator comprises a plurality of fins to form a larger heat-radiating area so that large quantity of heat can be taken away. Because aluminum-extrusion type and die-casting type heat radiators have limitations resulting from processing, folding type heat radiators are more commonly used nowadays.

As shown in FIGS. 1 and 2, fins 10a of a prior art folding type heat radiator are formed by punching a plurality of metal sheets 11a. Each of the metal sheets 11a comprises a rectangular main body 111a with two frills 112a joined at two sides thereof. The two frills 112a are parallel to each other, and are perpendicular to the main body 112a. Each of the two frills 112a has two slots 113a. Each of the slots 113a is connected with a retaining board 114a matching the slot 113a. A hook groove 115a is formed on each of the retaining boards 114a by means of pressing. When the fins 10a of a heat radiator are to be assembled together, the retaining board 114a needs to be placed into a slot 113'a at a corresponding position of another metal sheet 11'a, as shown in FIG. 2. Next, the hook groove 115a on the retaining board 114a is used to retain the slot 113'a of the metal sheet 11'a. In this way, the fins 10a of a heat radiator can be assembled together.

However, in addition that the slots 113a need to be formed by punching the metal sheets 11a, it is necessary to provide the retaining boards 114a, and it is also necessary to form the hook groove 115a on each of the retaining boards 114a by means of pressing, resulting in much difficult manufacture and assembly. Moreover, it takes much time and money.

Accordingly, the above fins of heat radiator have inconvenience and drawbacks in practical use. The present invention aims to resolve the problems in the prior art.

SUMMARY OF THE INVENTION

The primary object of the present invention is to provide a surrounding type fin-retaining structure of heat radiator, wherein grooves on frills of fins are retained with a retaining tool to easily fix the fins of a heat radiator. Moreover, the shape of the heat radiator is not limited, and many manufacturing and assembling steps can be saved.

To achieve the above object, the present invention provides a surrounding type fin-retaining structure of heat radiator comprising a retaining tool and a plurality of fins. The retaining tool is integrally formed. The fins are formed by punching metal sheets. Each of the metal sheets comprises a main body connected with two frills. Each of the frills has a groove with gaps at a predetermined position thereof. When the fins are tightly arranged together, the grooves on the frills will be tightly joined together to form a surrounding and closed shape. The retaining tool is manufactured to have the same size and shape as those of the grooves. The retaining tool is then placed into the grooves and retained therein to fix the fins of a heat radiator.

The various objects and advantages of the present invention will be more readily understood from the following detailed description when read in conjunction with the appended drawing, in which:

DETAILED DESCRIPTION OF THE PREFERRED EMBODIMENTS

Figure 1:
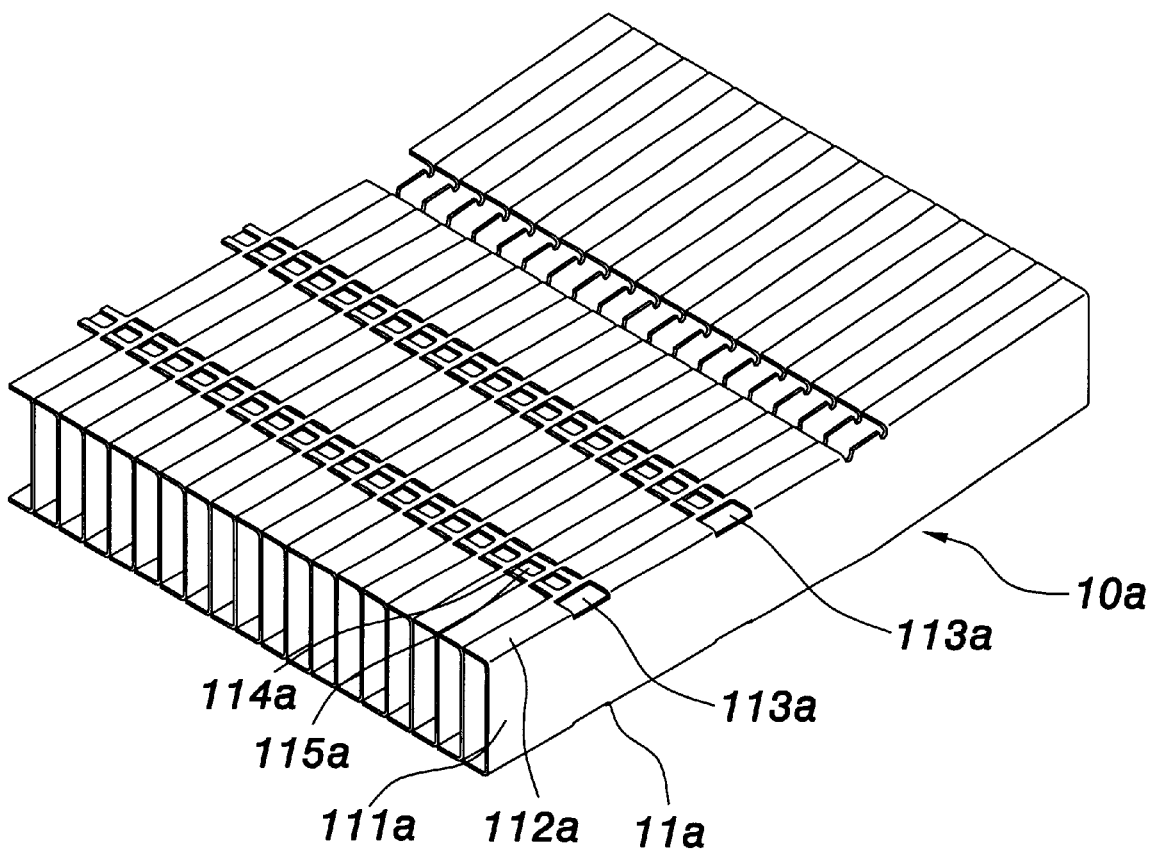
FIG. 1 is a perspective view of fins of a prior art heat radiator.
Figure 2:
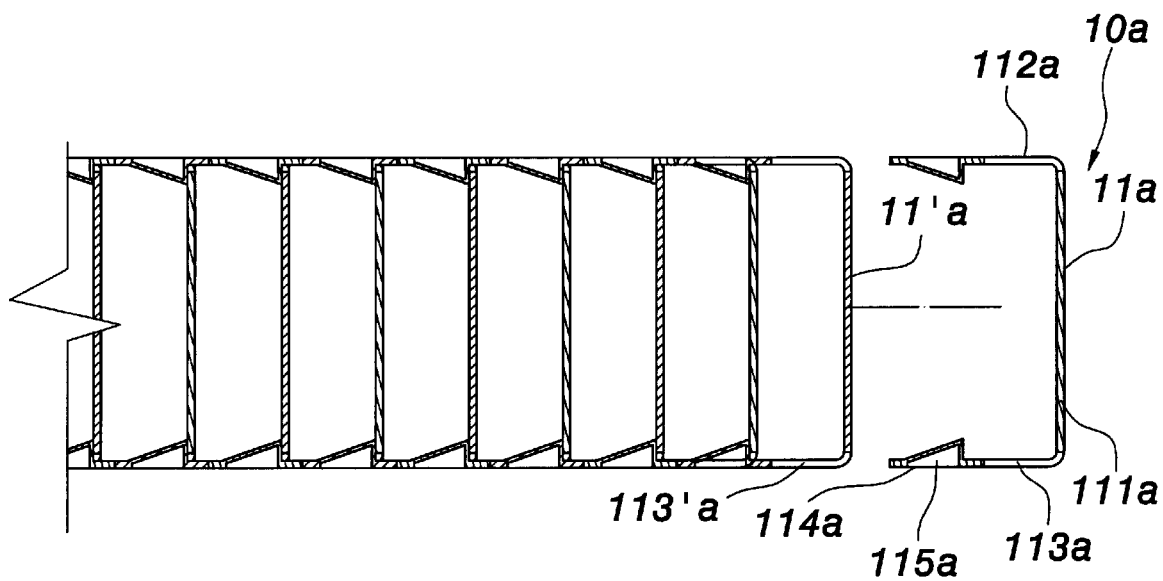
FIG. 2 is a diagram showing the retaining way of fins of a prior art heat radiator.
Figure 3:
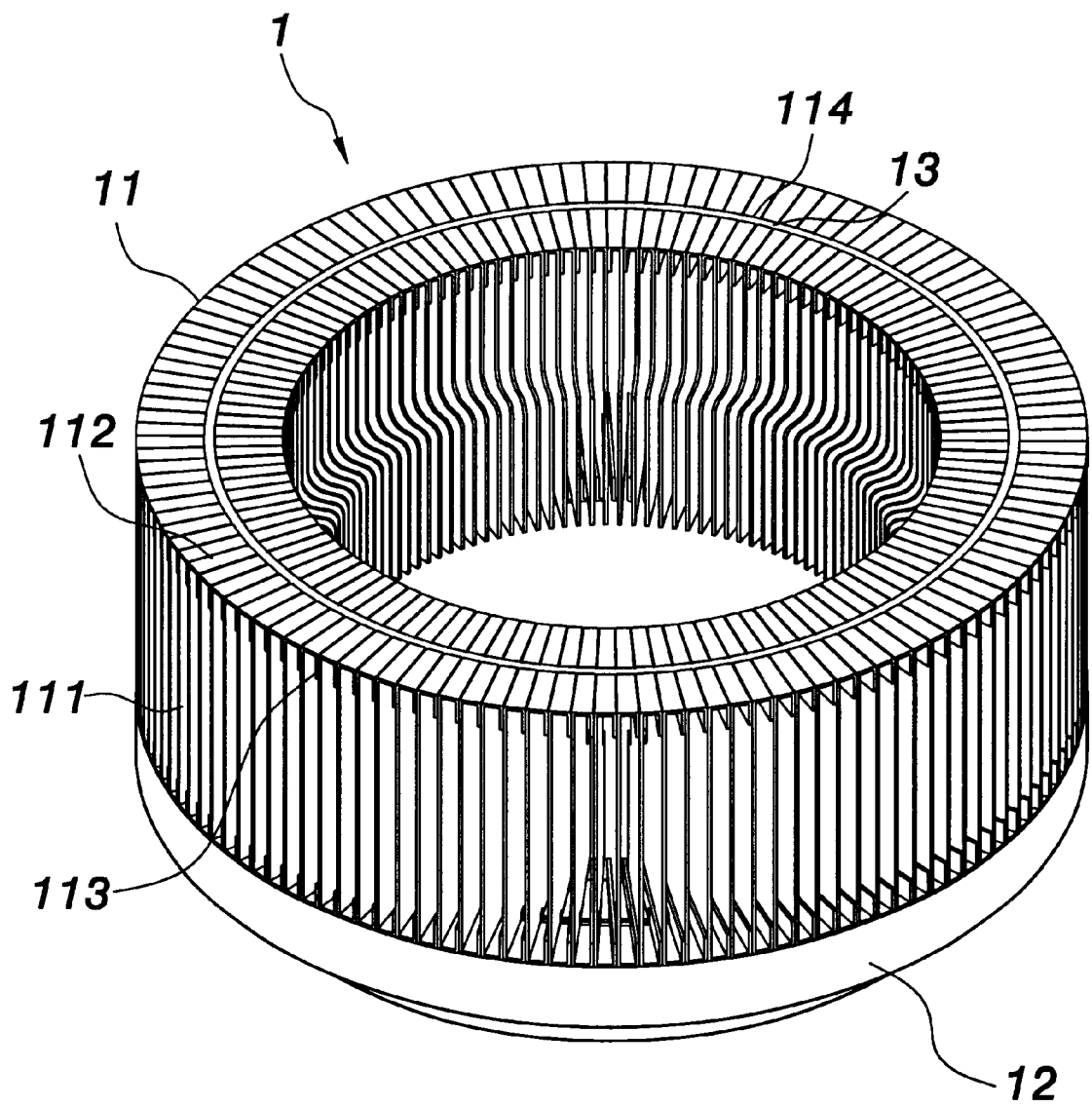
FIG. 3 is a perspective view of the present invention.
Figure 4:
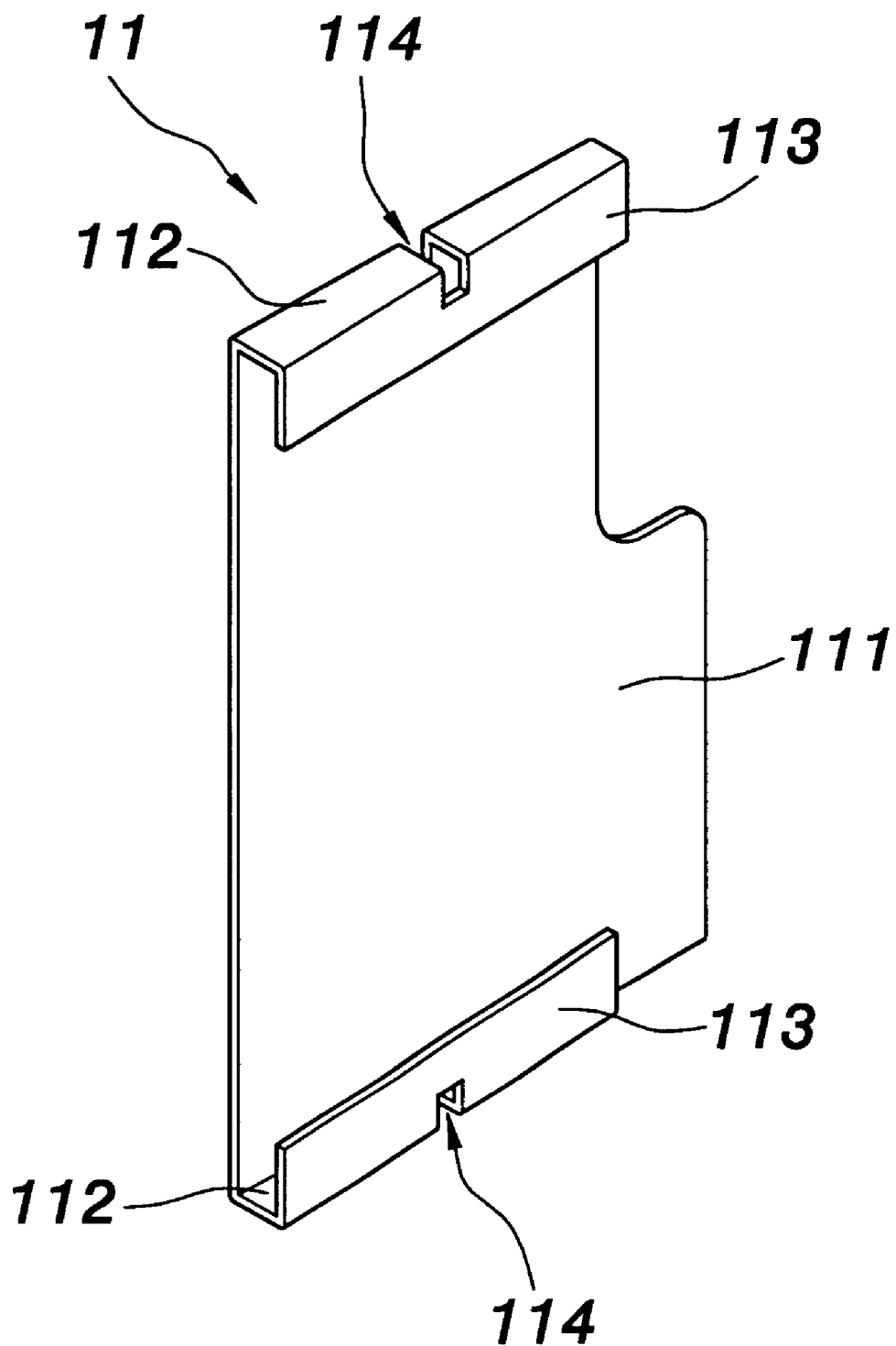
FIG. 4 is a perspective view of a single fin of the present invention.

As shown in FIGS. 2 to 5, the present invention provides a surrounding type fin-retaining structure of heat radiator comprising a heat radiator 1. The heat radiator 1 is formed by joining a plurality of fins 11 on a heat-radiating base 12. Each of the fins 11 is formed by punching metallic material. Each of the fins 11 comprises a main body 111, as shown in FIG. 4. An upper side and a lower side of the main body 111 join two frills 112, respectively. The two frills 112 are perpendicular to the main body 111, and are parallel to each other. The frills 112 are fan-shaped so that free ends of the frills 112 are slanting relative to the main body 111. The free ends of the frills 112 extend upwards and downwards to join two abutting portions 113, respectively. A groove 114 is formed at a position equidistant from the center of the heat radiator 1 on each of the frills 112. Two sides of the groove 114 are gaps.

Figure 5:
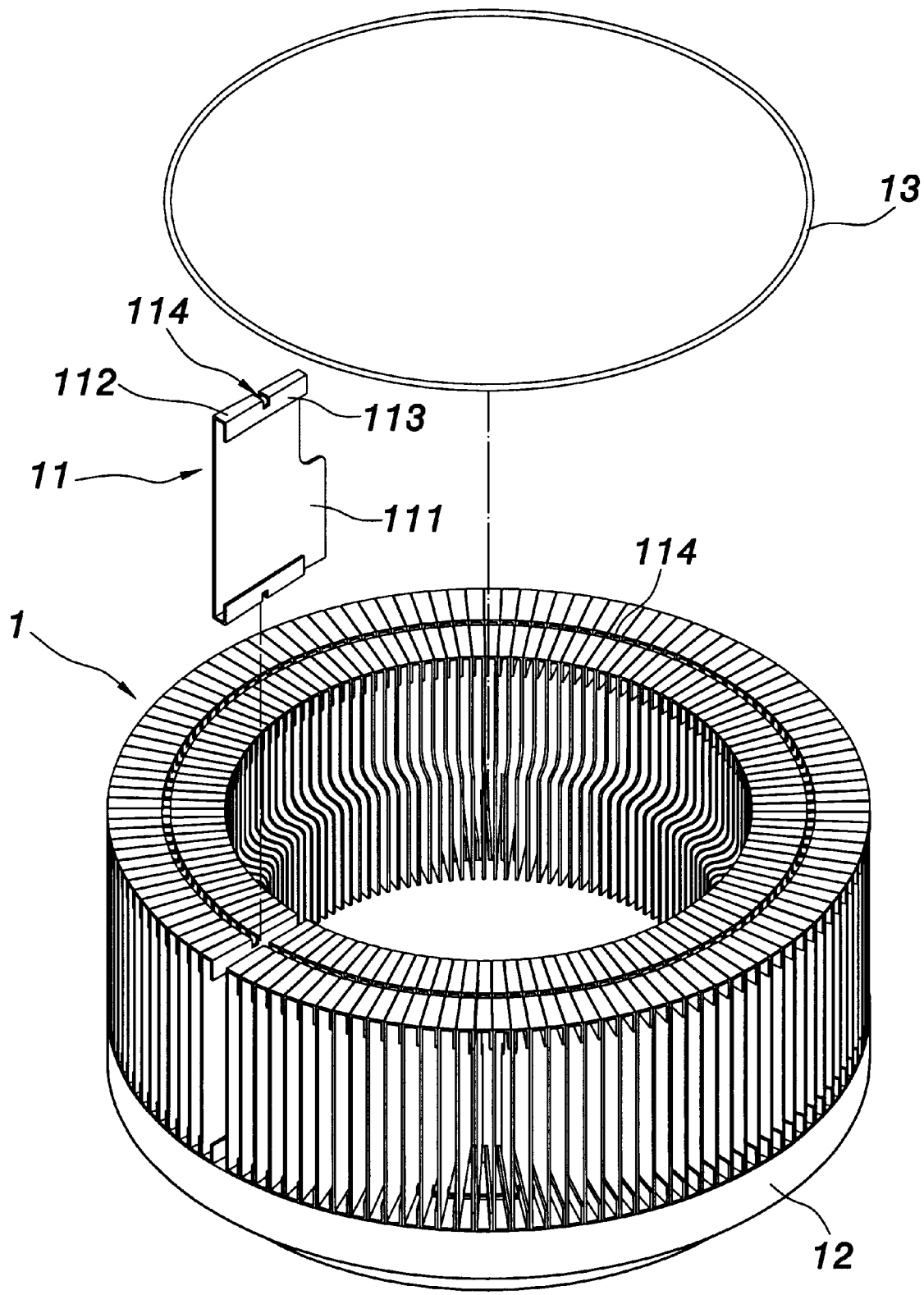
FIG. 5 is an exploded perspective view of the present invention.

After using the abutting portions 113 to tightly arrange the plurality of fins 11 to form a ring shape, the grooves 114 of the fins 11 are also tightly joined to form a closed ring shape, as shown in FIG. 5. A retaining tool 13 having the same size and shape as those of the ring shape is provided. The retaining tool 13 is integrally formed. The retaining tool 13 is placed into the grooves 114. Because the shape and size formed by the grooves 114 are the same as those of the retaining tool 13, the retaining tool 13 can be retained after being placed into the grooves 114. The plurality of fins 11 can thus be fixed. Next, the whole structure is joined on the heat-radiating base 12 to form the heat radiator 1, as shown in FIG. 3.

Figure 6:
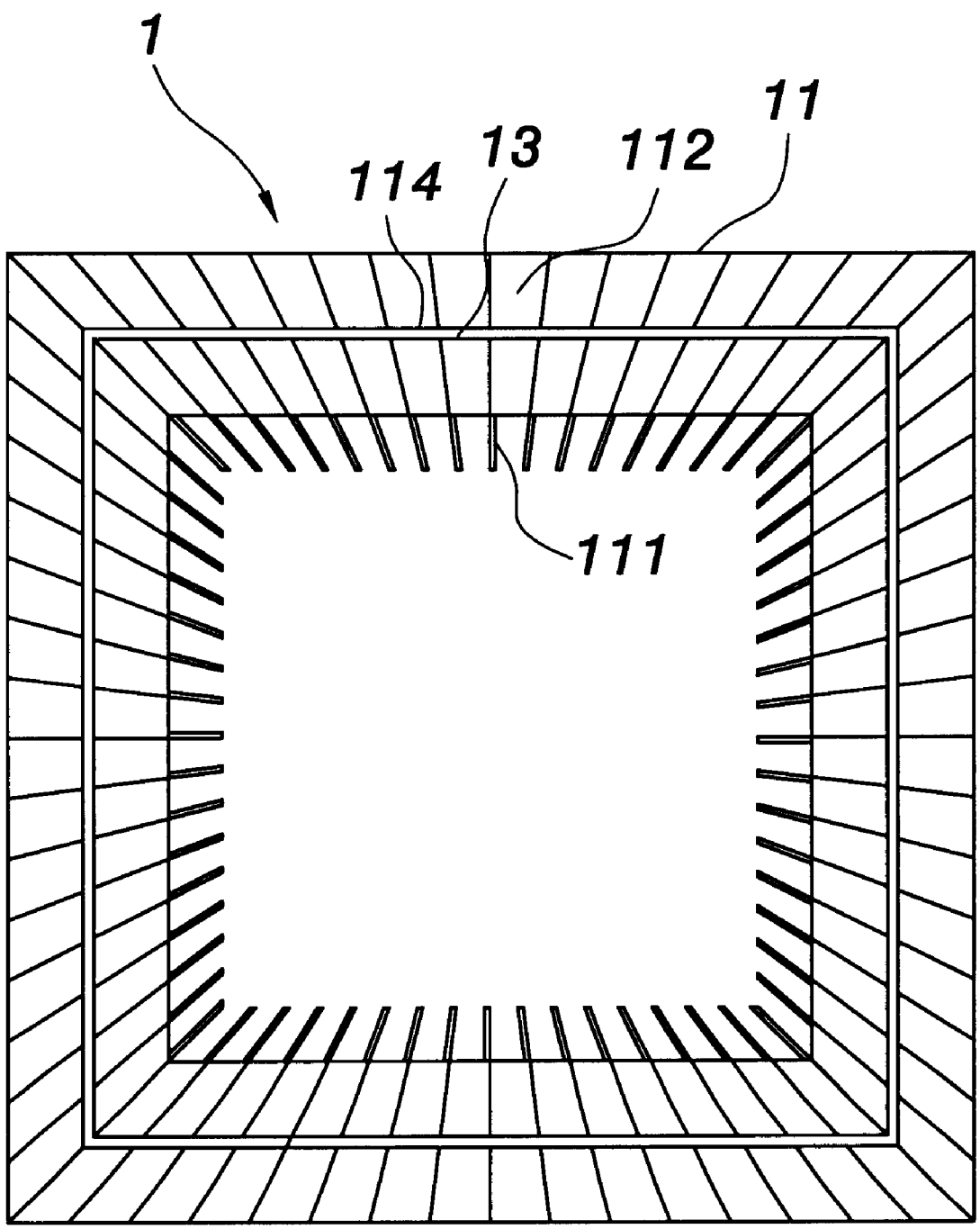
FIG. 6 is a plan diagram of another embodiment of the present invention.

As shown in FIG. 6, the plurality of fins 11 of the heat radiator 1 can be tightly arranged to form a square shape. The grooves 114 disposed at predetermined positions of the frills 112 are designed so that they can be tightly joined together to form a closed square shape similar to the shape of the heat radiator 1. The retaining tool 13 is manufactured to have the same shape as the square shape. Therefore, the retaining tool 13 can be placed into the grooves 114 and retained therein to fix the plurality of fins 11.

Figure 7:
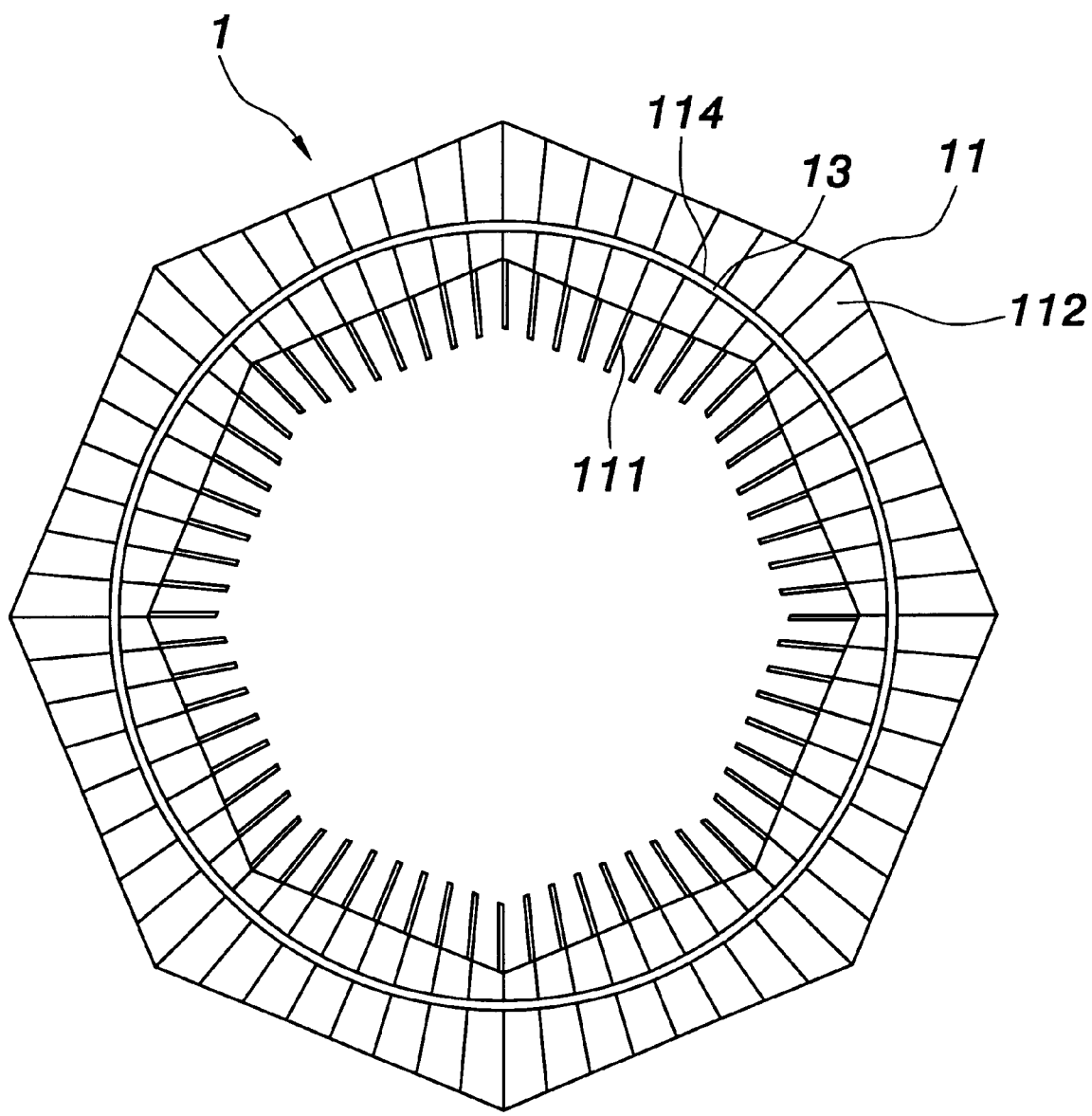
FIG. 7 is a plan view of yet another embodiment of the present invention.

As shown in FIG. 7, the plurality of fins 11 of the heat radiator 1 can also be tightly arranged to form an octagonal shape. The grooves 114 of the frills 112 can be disposed at positions equidistant from the center of the heat radiator 1. The grooves 114 are tightly joined together to form a closed ring shape. Similarly, the retaining tool 13 is manufactured to have the same shape as the ring shape. Therefore, the retaining tool 13 can be placed into the grooves 114 and retained therein to fix the plurality of fins 11.

To sum up, in a surrounding type fin-retaining structure of heat radiator of the present invention, grooves are formed at predetermined positions on fins by means of punching, and a retaining tool matching the shape of the grooves is placed into the grooves and retained therein to fix the fins of a heat radiator, thereby facilitating manufacture and assembly.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A surrounding type fin-retaining structure of a heat radiator comprising a retaining tool and a plurality of fins, said retaining tool being integrally formed, said fins being formed by punching metal sheets, each of said metal sheets comprising a main body connected with frills, each of said frills having a groove with gaps at a predetermined position thereof, said grooves on said frills being tightly joined together to form a surrounding and closed shape after said plurality of fins are tightly arranged together, said retaining tool being manufactured to have the same size and shape as those of said grooves, said retaining tool being placed into said grooves to retain said fins of the heat radiator.

2. The surrounding type fin-retaining structure of a heat radiator as claimed in claim 1, wherein said grooves are tightly joined together to form a closed ring shape.

3. The surrounding type fin-retaining structure of a heat radiator as claimed in claim 1, wherein said grooves are tightly joined together to form a closed shape similar to the shape of said heat radiator.

4. The surrounding type fin-retaining structure of a heat radiator as claimed in claim 1, wherein said frills are disposed at an upper side and a lower side of said main body.

5. The surrounding type fin-retaining structure of a heat radiator as claimed in claim 1, wherein said frills are perpendicular to said main body.

6. The surrounding type fin-retaining structure of a heat radiator as claimed in claim 1, wherein free ends of said frills extend to join abutting portions so that said fins can be tightly arranged together through the help of said abutting portions.

* * * * *